US012588430B2

(12) United States Patent
Nugent et al.

(10) Patent No.: US 12,588,430 B2
(45) Date of Patent: Mar. 24, 2026

(54) ELEMENTAL COMPOSITION TUNING FOR CHALCOGENIDE BASED MEMORY ARRANGED IN A PLURALITY OF DECKS

(71) Applicant: SK Hynix NAND Product Solutions Corp., Rancho Cordova, CA (US)

(72) Inventors: John M. Nugent, Corrales, NM (US); Kumar R. Virwani, San Jose, CA (US); Fred Daniel Gealy, Kuna, ID (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 951 days.

(21) Appl. No.: 17/163,155

(22) Filed: Jan. 29, 2021

(65) Prior Publication Data

US 2022/0246847 A1 Aug. 4, 2022

(51) Int. Cl.
| | |
|---|---|
| *H10N 70/00* | (2023.01) |
| *G11C 13/00* | (2006.01) |
| *H10B 63/00* | (2023.01) |
| *H10N 70/20* | (2023.01) |

(52) U.S. Cl.
CPC ....... *H10N 70/882* (2023.02); *G11C 13/0004* (2013.01); *G11C 13/003* (2013.01); *G11C 13/0069* (2013.01); *H10B 63/24* (2023.02); *H10B 63/84* (2023.02); *H10N 70/011* (2023.02); *H10N 70/231* (2023.02); *G11C 2213/72* (2013.01)

(58) Field of Classification Search
CPC .. H10N 70/882; H10N 70/011; H10N 70/231;
H10N 70/826; H10N 70/8828; G11C 13/0004; G11C 13/003; G11C 13/0069; G11C 2213/72; G11C 13/004; G11C 2013/0073; H10B 63/24; H10B 63/84
See application file for complete search history.

(56) References Cited

U.S. PATENT DOCUMENTS

| | | | | |
|---|---|---|---|---|
| 2004/0264234 A1* | 12/2004 | Moore | .............. | G11C 16/3431 |
| | | | | 365/148 |
| 2012/0134203 A1* | 5/2012 | Miura | ............... | G11C 13/0061 |
| | | | | 365/163 |
| 2018/0019392 A1* | 1/2018 | Lee | ...................... | H10N 70/011 |
| 2019/0189206 A1* | 6/2019 | Tortorelli | .......... | G11C 13/0038 |
| 2023/0114966 A1* | 4/2023 | Boniardi | ............. | G11C 13/003 |
| | | | | 365/45 |

OTHER PUBLICATIONS

Guerin, Samuel et al., "Synthesis and Screening of Phase Change Chalcogenide Thin Film Materials for Data Storage," ACS Combinatorial Science, University of Windsor, May 25, 2017 (44 pages).

* cited by examiner

*Primary Examiner* — Jerome Leboeuf
(74) *Attorney, Agent, or Firm* — HG LAW LLP

(57) ABSTRACT

A memory device including a memory array comprising a plurality of decks, a respective deck comprising a plurality of memory cells, a respective memory cell comprising a storage element comprising a chalcogenide material; wherein a first deck of the plurality of decks comprises first memory cells with storage elements deposited at a first initial composition of a plurality of elements; and a second deck of the plurality of decks comprises second memory cells with storage elements deposited at a second initial composition of the plurality of elements.

20 Claims, 9 Drawing Sheets

400

215

217

207

420

207

422

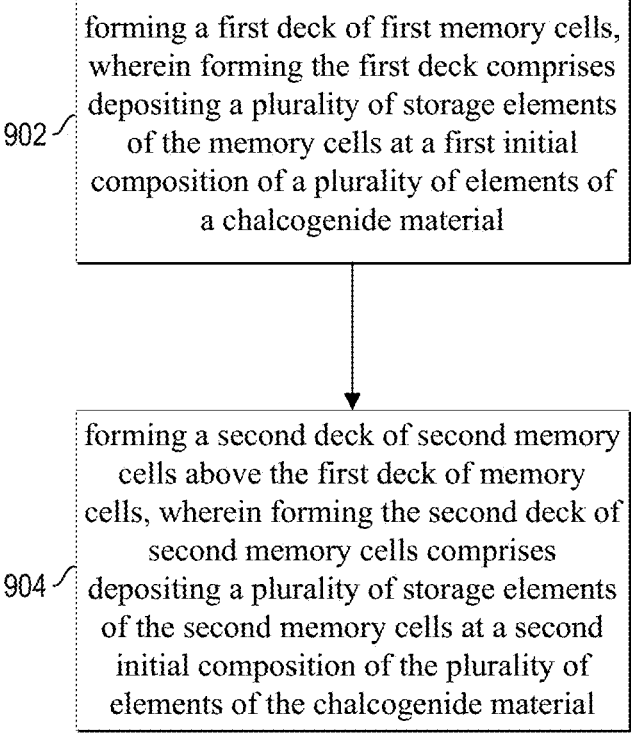

902 — forming a first deck of first memory cells, wherein forming the first deck comprises depositing a plurality of storage elements of the memory cells at a first initial composition of a plurality of elements of a chalcogenide material 904 — forming a second deck of second memory cells above the first deck of memory cells, wherein forming the second deck of second memory cells comprises depositing a plurality of storage elements of the second memory cells at a second initial composition of the plurality of elements of the chalcogenide material

FIG. 9

ELEMENTAL COMPOSITION TUNING FOR CHALCOGENIDE BASED MEMORY ARRANGED IN A PLURALITY OF DECKS

BACKGROUND

A storage device may include non-volatile memory, such as multi-stack 3D crosspoint memory arrays. Memory cells of the memory arrays may be programmed via wordlines and bitlines of the memory array.

BRIEF DESCRIPTION OF THE DRAWINGS

FIG. 9 illustrates a flow for manufacturing a memory array in accordance with certain embodiments.

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
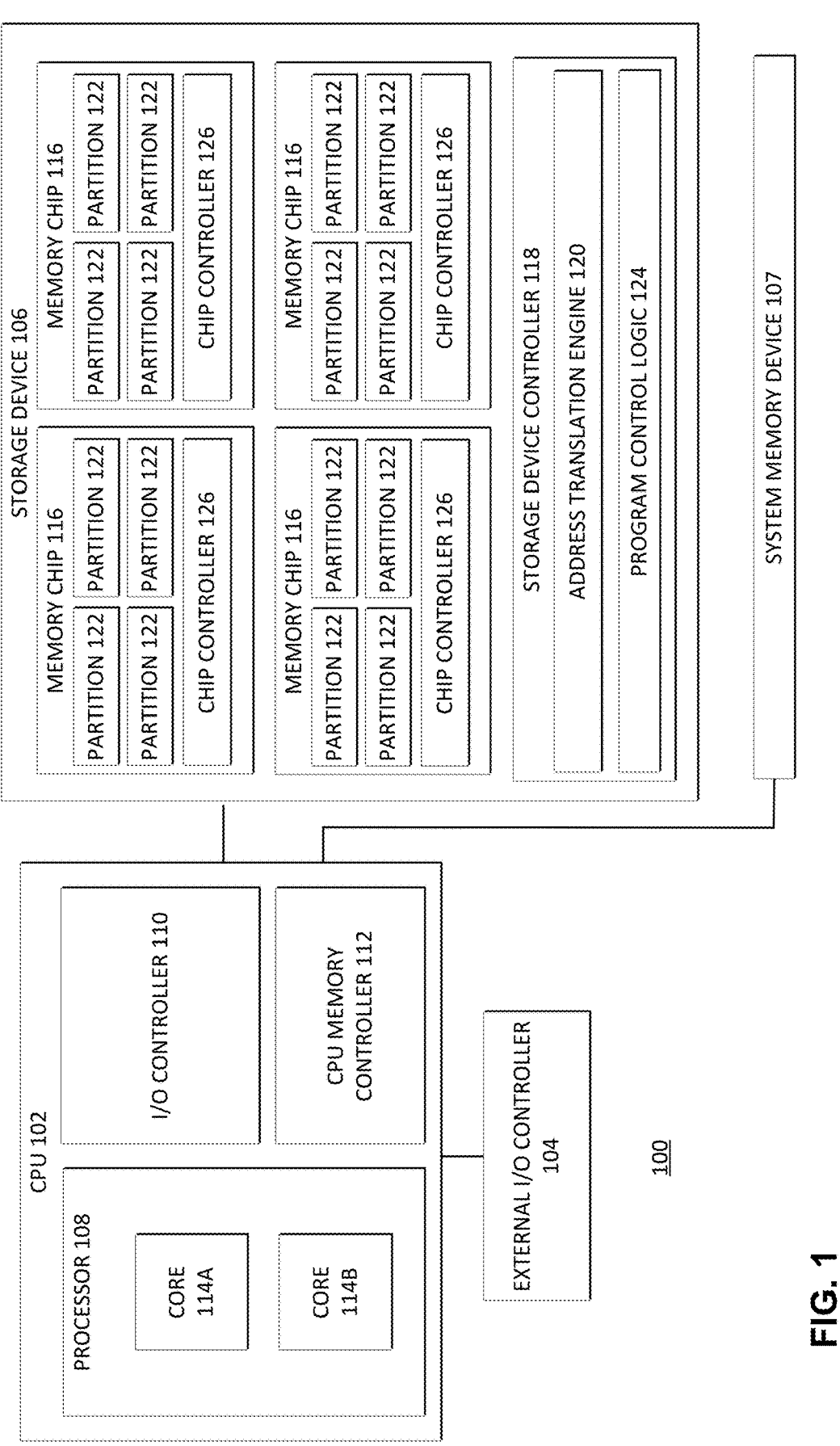
FIG. 1 illustrates components of a computer system in accordance with certain embodiments.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD) or a dual inline memory module (DIMM), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 (or other logical grouping of memory cells) may include a multi-deck memory array, such as a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid. In various embodiments, the storage elements of the memory cells may include a chalcogenide material. In such memory arrays, a memory cell's programmed state (e.g., '0' or '1' in a single-level cell or '00', '10', '01', or '11' in a multi-level cell) is stored in a cell's threshold voltage or other voltage of the cell that may be ascertained through any suitable read algorithm.

In multi-deck memory arrays with memory cells comprising a chalcogenide material for storage elements, many electrical characteristics do not fully match between the decks. As just one example, set speed may vary between memory cells of different decks. Due to thermal environment and geometric asymmetry relative to current flow direction, elemental composition distributions within bits of different decks may not be matched even when the bits start at the same overall composition. The evolution of the elemental distribution evolves differently in the decks, resulting in unmatched transport behavior and kinetics.

Various embodiments of the present disclosure address the fundamental differences between decks and the resulting thermodynamics and kinetics by altering the starting point compositions of the storage elements by deck to accommodate for the differing elemental evolution in the bits as a result of the geometric, thermal, and electrical differences between decks. In various embodiments, the composition is tailored to maintain optimal device operation over time. Such tuning may improve both yield and lifespan of memory devices.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http:// www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), chalcogenide based memory (e.g., memory in which a storage element comprises a chalcogenide material), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises a multi-deck chalcogenide based memory array, such as a 3D crosspoint memory array. Various examples of multi-deck arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC) engine. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g., cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
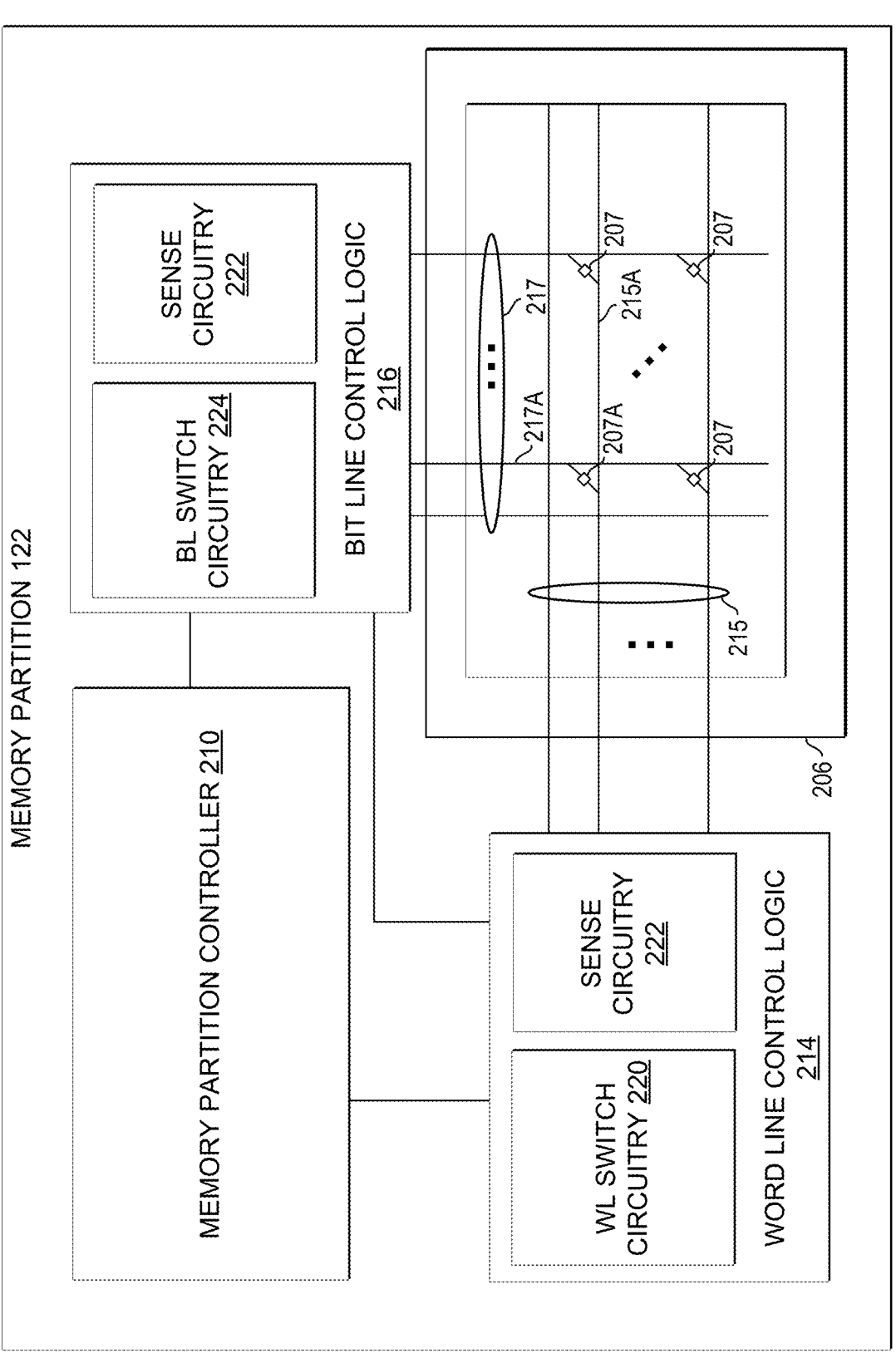
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include a chalcogenide based memory or other suitable memory type. In some embodiments, memory partition 122 may comprise a 3D crosspoint memory array 206 that comprises a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline, and each horizontal plane of memory cells may be referred to as a deck. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read demarcation voltage (VDM). The VDM may induce a current (icell) in the memory cell 207A dependent on a program state of the memory cell. A comparator such as a sense amplifier may compare icell with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
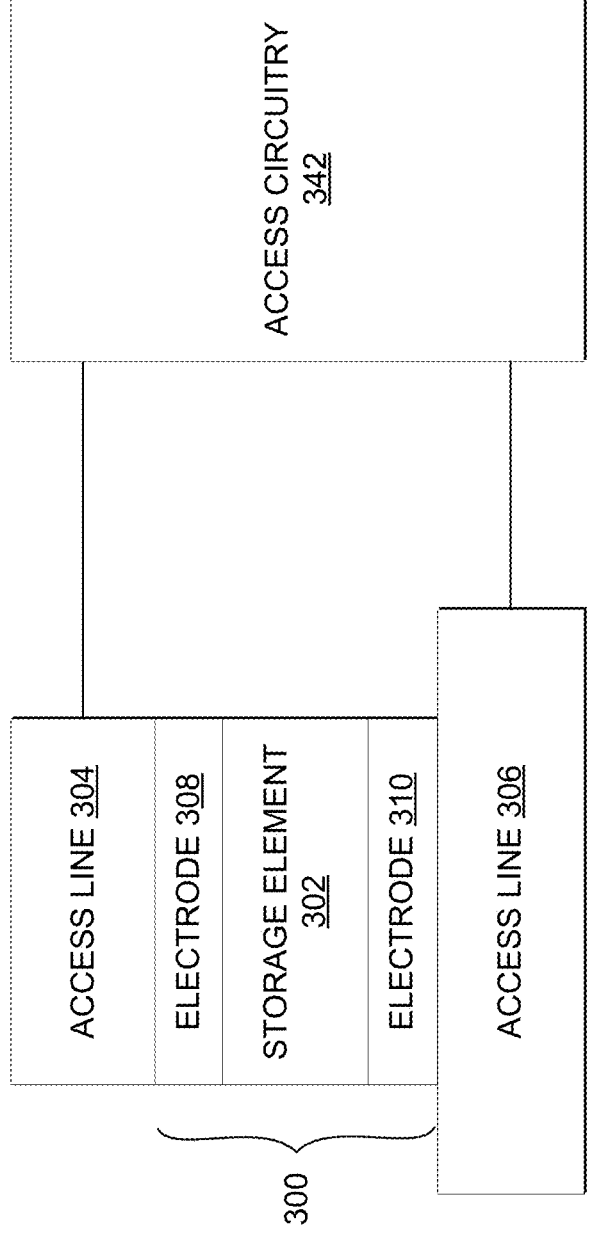
FIG. 3 illustrates a memory cell coupled to access circuitry in accordance with certain embodiments.

FIG. 3 illustrates a memory cell 300 coupled to access circuitry 342 in accordance with certain embodiments. The memory cell 300 includes a storage element 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In some embodiments, each memory cell (e.g., 300) includes a memory element configured to store information and a separate memory cell select device (e.g., selector)

coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device. In the embodiment depicted, each memory cell 300 is a two-terminal device (i.e., the memory cell 300 has two electrodes to receive control signals sufficient to write to and read from the memory cell 300).

In one embodiment, storage element 302 includes a self-selecting material that exhibits memory effects. A self-selecting material is a material that enables selection of a memory cell in an array without requiring a separate selector element. Thus, storage element 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage element 302 to be in a particular state. The storage element 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state.

The storage element 302 may include any suitable material programmable to a plurality of states. In some embodiments, the storage element 302 may include a chalcogenide material comprising a chemical compound with at least one chalcogen ion, that is, an element from group 16 of the periodic table. For example, the storage element 302 may include one or more of: sulfur (S), selenium (Se), or tellurium (Te). Additionally or alternatively, in various embodiments, storage element 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage element 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage element 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage element 302) may be dopants. For example, the storage material 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage element 302) may include additional elements such as hydrogen (H), oxygen (O), nitrogen (N), chlorine (Cl), or fluorine (F), each in atomic or molecular forms. The storage element 302 may include other materials or dopants not explicitly listed. In some examples, the storage element (such as any of the materials described above) is a phase change material. In other examples, the storage element 302 is not a phase change material, e.g., can be in one or multiple stable states (or transition between stable states) without a change in phase.

In some embodiments, a selector element coupled to storage element (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage element is capable of switching between two or more stable states without changing phase (in other examples the storage element may switch between two stable states by changing phase). In one such embodiment, the access circuitry 342 programs the memory cell 300 by applying one or more program pulses (e.g., voltage or current pulses) with a particular polarity to cause the storage element 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300.

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity and application of current for a duration of time, which causes the memory cell 300 to exhibit a particular threshold voltage at a subsequent reading voltage of a same or different polarity.

Access circuitry 342 may write to or read a memory cell 300 by applying one or more pulses having a particular magnitude, pulse width, and polarity to the terminals (e.g., electrodes 308, 310) of the memory cell. The amplitude or width of a program pulse can vary depending on implementation. The pulse polarity may be positive or negative.

A positive programming pulse refers to a programming pulse with "positive polarity," which can also be referred to as "forward polarity." A negative programming pulse is a program pulse with "negative polarity," which can also be referred to as "reverse polarity." In one example, whether or not a programming pulse is positive or negative is based on the relative voltages applied to the terminals of the memory cell (e.g., 300). A program pulse can be defined as positive if the resulting voltage applied to one of the terminals is more positive than the voltage applied to a second of the terminals. For example, referring to FIG. 3, a positive program pulse can include: a positive voltage applied to electrode 308 and a negative voltage applied to electrode 310; a positive voltage applied to 308 and 0 V (e.g., circuit ground or neutral reference) applied to electrode 310; 0V applied to electrode 308 and a negative voltage applied to electrode 310, positive voltages applied to both electrodes 308 and 310, but where the voltage applied to electrode 308 is greater than the voltage applied to electrode 310; or negative voltages applied to both electrodes 308 and 310, but where the magnitude of the voltage applied to electrode 310 is greater than the magnitude of the voltage applied to electrode 308.

A program pulse applied to the terminals of the memory cell (e.g., 300) would be negative if the voltage applied to electrode 310 is more positive than the voltage applied to electrode 308. For example, a negative program pulse can include: a negative voltage applied to electrode 308 and a positive voltage applied to electrode 310; a negative voltage applied to electrode 308 and 0 V (e.g., circuit ground or neutral reference) applied to electrode 310; 0 V applied to electrode 308 and a positive voltage applied to electrode 310, negative voltages applied to both electrodes 308 and 310, but where the magnitude of the voltage applied to electrode 308 is greater than the magnitude of the voltage applied to electrode 310; or positive voltages applied to both electrodes 308 and 310, but where the magnitude of the voltage applied to electrode 310 is greater than the magnitude of the voltage applied to electrode 308.

The program pulses can have any of a variety of shapes. For example, the program pulses may be box-shaped (also commonly referred to as rectangular-shaped or square-shaped), triangular (e.g., ramped), trapezoidal, rectangular, box, and/or sinusoidal pulses. In actual implementations, the program pulses may have leading or trailing edges. In some cases, the actual pulse shape may be the shape resulting from a discharge of transient current as governed by memory array and circuit parasitics. Thus, circuitry for accessing memory cells can apply programming pulses having a variety of shapes and durations sufficient to cause the memory cells to threshold into the desired state.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308 are disposed between storage element 302 and access lines 304, 306. Electrodes 308 electrically couple access lines 304, 306 to storage element 302. Electrodes 308 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Figure 4:
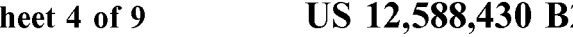
FIG. 4 is a perspective view of portions of a three dimensional (3D) crosspoint memory stack in accordance with certain embodiments.
Figure 5:
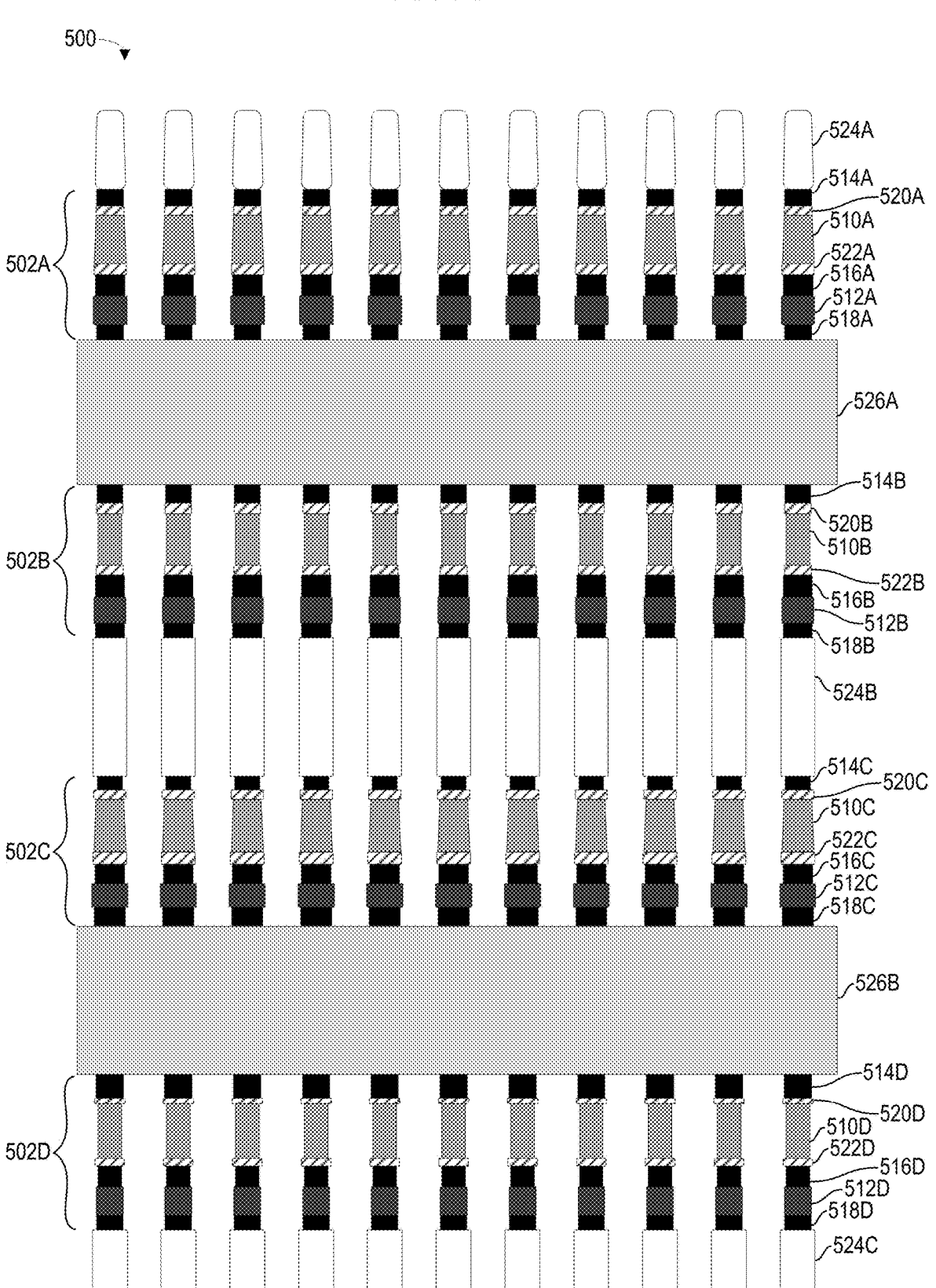
FIG. 5 is a cross section of a multi-deck memory stack in accordance with certain embodiments.

The memory cell 300 is one example of a memory cell that may be used to store one or more logical bits. Other embodiments can include memory cells having additional or different layers of material than illustrated in FIG. 3 (e.g., a selection device between the access line 304 and the storage element, a thin dielectric material between the storage element and access lines, or other suitable configuration). FIGS. 4 and 5 depict further examples of memory architectures of various embodiments.

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

FIG. 5 is a cross section of a multi-deck memory array 500 in accordance with certain embodiments. Array 500 comprises a plurality of decks 502 (e.g., 502A, 502B, 502C, 502D). A deck 502 includes a plurality of memory cells in a common layer of the memory array 500. A memory cell of a deck may be coupled to a respective bitline 526 (e.g., one of 526A or 526B) and a respective wordline 524 (e.g., one of 524A, 524B, or 524C). Thus, a deck 502 may comprise all of the memory cells in a horizontal plane of the array between a set of row address lines (e.g., one of wordline sets 524) and a set of column address lines (e.g., one of bitline sets 526). As depicted, the decks 502 are stacked in a vertical direction in top of each other. In various embodiments, a memory array may include any suitable number of decks, such as one, two, four, six, or other suitable number of decks. Referring back to FIG. 4, a pillar 420 of memory cell stacks may include a memory cell from each of a plurality of the decks 502.

This disclosure contemplates any suitable arrangement, composition, and dimensions of a memory cell. In the embodiment depicted, a memory cell includes a top electrode 514 (e.g., a respective one of 514A-D), a top lamina 520 (e.g., a respective one of 520A-D) a storage element 510 (e.g., a respective one of 510A-D), a bottom lamina 522 (e.g., a respective one of 522A-D), a middle electrode 516 (e.g., a respective one of 516A-D), a threshold switch 512 (e.g., a respective one of 512A-D), and a bottom electrode 518 (e.g., a respective one of 518A-D). The electrodes 514, 516, and 518 may comprise any suitable conductive material, such as carbon, or any of the materials described above in connection with electrodes 308 and 310. Laminae 520 and 522 may be used to control work function matching and may include, e.g., tungsten. Storage element 510 may correspond to storage element 302 and may include any of the materials described in connection thereto or other suitable material.

Threshold switch 512 may be, e.g., an ovonic switch that allows the conduction of current through an addressed memory cell (or other suitable switch, e.g., a switch such as described herein). Although not shown, in some embodiments, a thin layer of silicon nitride may also be present above the top electrodes 514A and below the bottom electrodes 518.

The array 500 also includes a plurality of wordline sets 524 (e.g., 524A-C). The wordlines 524A may be coupled to the memory cells of deck 502A, the wordlines 524B may be coupled to the memory cells of decks 502B and 502C, and the wordlines 524C may be coupled to the memory cells of deck 502D (with each memory cell coupled to a single one of wordlines 524). The array 500 also includes a plurality of bitline sets 526 (e.g., 526A-B). Bitlines 526A are each coupled to a respective group of memory cells in deck 502A and a respective group of memory cells in deck 502B. Bitlines 526B are each coupled to a respective group of memory cells in deck 502C and a respective group of memory cells in deck 502D.

The uppermost deck 502A and the lowermost deck 502D (e.g., decks that only share one of a set of bitlines or wordlines with another deck) may be referred to as outer decks, while the other decks in between the uppermost deck 502A and lowermost deck 502D (e.g., decks that share both a set of bitlines with one deck and a set of wordlines with another deck) may be referred to as inner decks.

Decks may also be referred to as odd or even decks. In one nomenclature, the uppermost deck and every other deck below the uppermost deck may be referred to as even decks while the other decks may be referred to as odd decks. For example, deck 502A and deck 502C may be referred to as even decks and deck 502B and deck 502D may be referred to as odd decks (or vice versa). In some embodiments, the memory cells of the even decks may be programmed with program pulses have a first polarity (e.g., positive) while the memory cells of the odd decks may be programmed with program pulses having an opposite polarity (e.g., negative). Such an embodiment may allow for simpler implementation of the circuitry driving the wordlines 524 and the circuitry driving the bitlines 526 (as the circutries would not need to switch polarity when programming cells of adjacent decks). Thus, as the biasing voltage may be opposite between even and odd decks, the direction of the current flow through the cells is also opposite.

The memory cells of a deck 502 may differ in structural or operational aspects from memory cells of one or more of the other decks 502. For example, the dimensions of one or more portions of the memory cells of one deck may be different from the corresponding dimensions of memory cells of another deck (for example, in the embodiment depicted, the storage elements are shown as having slightly different shapes in even and odd decks). As another example, the direction of the current flowing through the memory cells of one deck during program and/or read operations may be opposite to the direction of current flowing during corresponding operations on memory cells of another deck. As another example, memory cells in one deck may have different thermal characteristics than the memory cells in another deck. For example, heat may transfer to, from, or within elements of the memory cells at different rates. As one illustration heat from a top portion of a storage element 510A may dissipate more quickly (e.g., through a conductor such as a wordline 524A) than heat from a bottom portion of a storage element 510A (which may need to pass through additional layers to reach a conductor such as bitline 526A). The thermal characteristics may be a function of the geometries and compositions of the memory cells and supporting circuitry of the memory array 500.

In various chalcogenide based storage materials that may be used as a storage element such as 302 or 510, the atoms of the various elements (e.g., atomic elements) of the storage element may migrate within the storage element over time, resulting in different local compositions within the storage element. For example, when a memory array is initially manufactured, the composition within a storage element 510A may be generally uniform across the storage element 510A (e.g., at an initial composition). After a number of program cycles, the storage element 510A may have different compositions at different locations within the storage element 510A. To illustrate, a storage element 510A may initially have a uniform composition of X % of element A, Y % of element B, and Z % of element C. After a number of program cycles, a first portion of storage element 510A could have a composition of $X_1$% of element A, $Y_1$% of element B, and $Z_1$% of element C; a second portion of storage element 510A could have a composition of $X_2$% of element A, $Y_2$% of element B, and $Z_2$% of element C; a third portion of storage element 510A could have a composition of $X_3$% of element A, $Y_3$% of element B, and $Z_3$% of element C; and so on. In reality, due to the size of individual atoms, the storage element 510A may have a very large number of different compositions throughout the storage element 510A. The migration of the atoms may vary across the decks depending on the characteristics of the memory cells in the decks. For example, after the same number of program cycles, corresponding locations of storage element 510B of a different deck 502B may have compositions that are different from the compositions of storage element 510A.

The elemental distribution evolves differently across the decks, resulting in unmatched transport behavior and kinetics of memory cells of different decks, due to different physical properties across the memory cells, such as liquidus and/or solidus temperatures. The differing physical properties may result in non-uniform operation in the memory cells across the decks. As an example, after a number of program cycles lead to migration of atoms within the storage elements 510, the average set speed (e.g., the amount of time required to program a memory cell into a set state) of memory cells of a first deck may be different from the average set speed of memory cells of a second deck.

Figure 6:
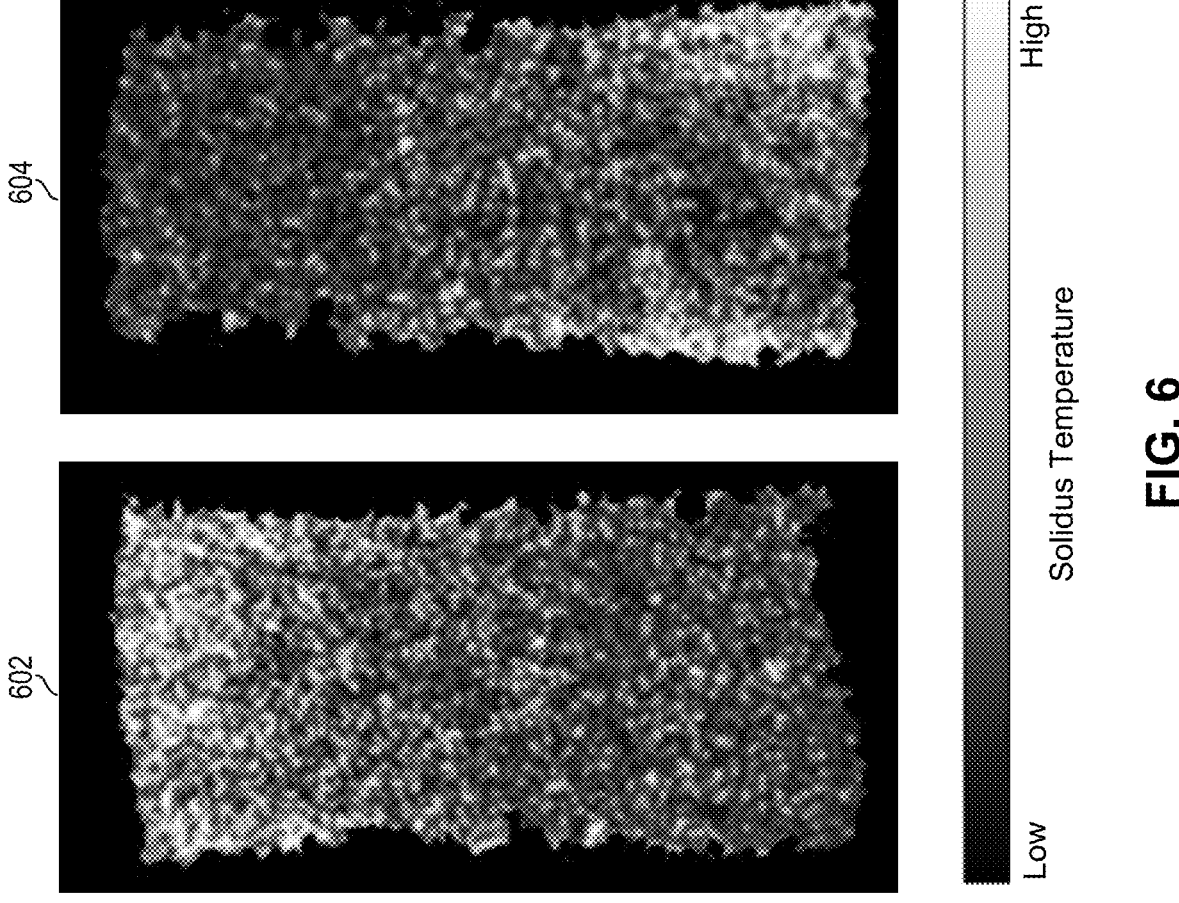
FIG. 6 is a diagram of solidus temperatures at various points of memory cells of different decks in accordance with certain embodiments.

FIG. 6 include illustrations of two storage elements 602 and 604 from different decks and associated solidus temperatures in accordance with certain embodiments. A solidus temperature represents the temperature below which the associated composition is completely solid (crystallized) and thus is the temperature at which melting begins. In some implementations, the solidus temperature is also the temperature at which a disordered state begins conversion to a crystalline state.

These illustrations show how the elemental compositions across storage elements may evolve differently from an initial uniform composition applied to both storage elements (since different solidus temperatures indicate different compositions). Storage element 602 may be part of a memory cell in a first deck and storage element 604 may be part of a memory cell in a second deck. As illustrated, storage element 602 has various elemental compositions at various locations, resulting in different solidus temperatures. Storage element 604 has different elemental compositions at corresponding locations, resulting in solidus temperatures that are different from the corresponding solidus temperatures of storage element 602.

In some embodiments, storage element 602 and storage element 604 may be programmed using opposite polarities. Accordingly, the elemental compositions with higher solidus temperatures are shown generally on opposing ends (e.g., the top of 602 and the bottom of 604). When the solidus temperatures of a storage element are too high (or there is a sufficient mass of compositions having relatively high solidus temperatures within a storage element), the transition between states (e.g., a crystalline state and an amorphous state) may be impeded (e.g., slower than desired). In the embodiment depicted, the greater incidence of high solidus temperatures appears at the terminating side of the crystal growth. Thus, at the end of the growth, there is a greater mass of material that is harder to transform. As shown, the solidus temperatures for the storage elements 602 and 604 of the different decks are not symmetric. Thus, the solidus temperatures in the respective growth regions of storage element 602 and 604 do not match. Similarly, the solidus temperatures in the respective nucleation regions do not match.

Although the physical property in the form of a solidus temperature is shown in the illustrations, the migration of atoms may similarly cause variances in other physical properties (e.g., a liquidus temperature which represents the temperature at which a composition is completely melted).

Figure 7:
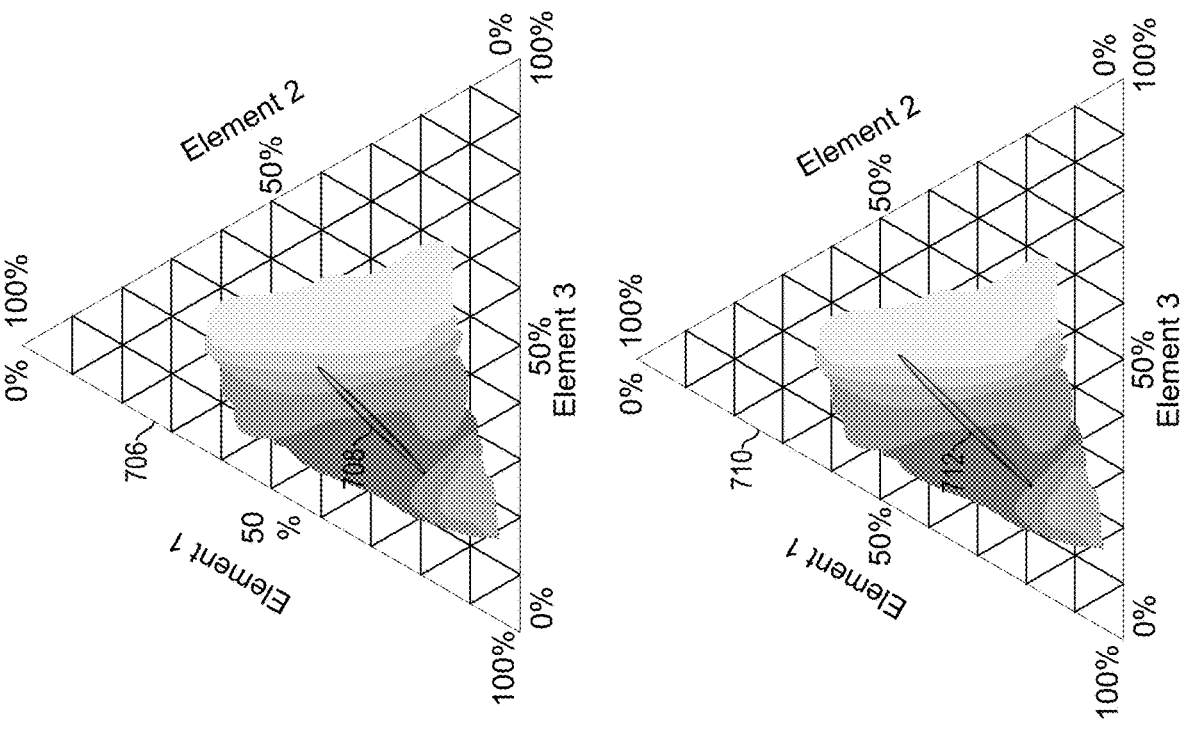
FIG. 7 illustrates solidus temperature changes due to composition migration in memory cells of different decks having the same initial elemental composition in accordance with certain embodiments.
Figure 7:
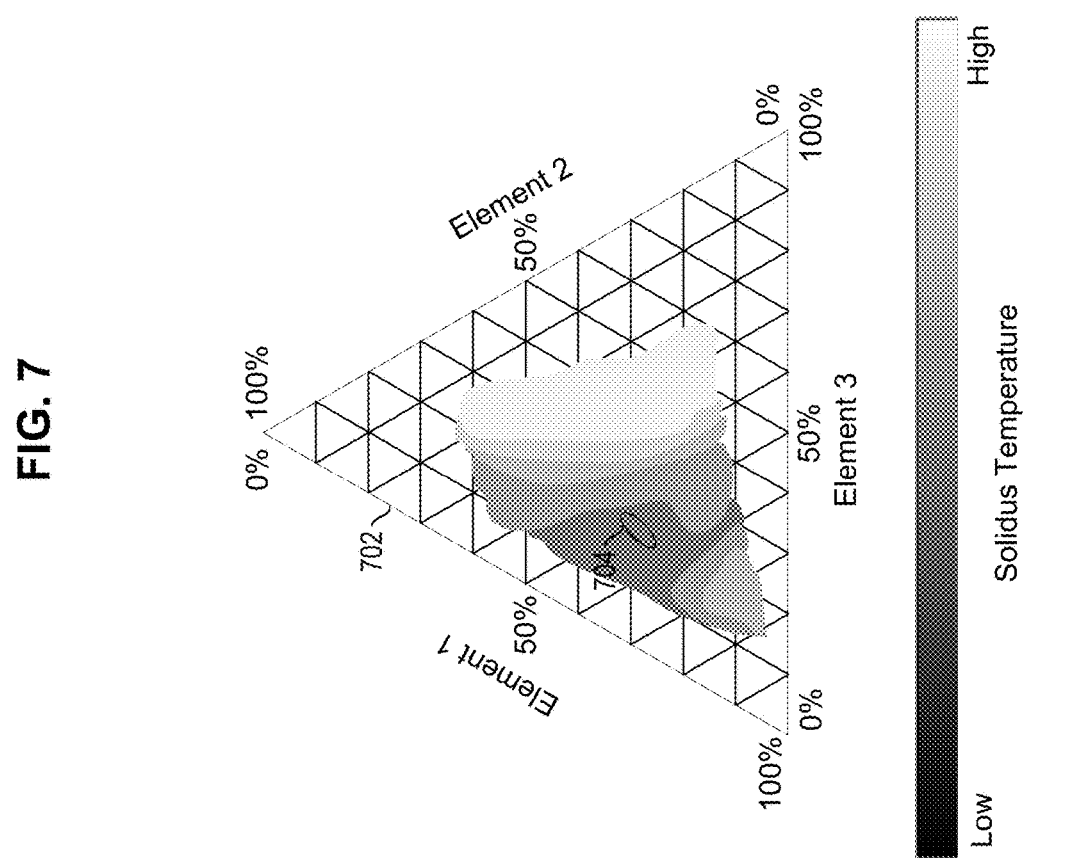
Figure 8:
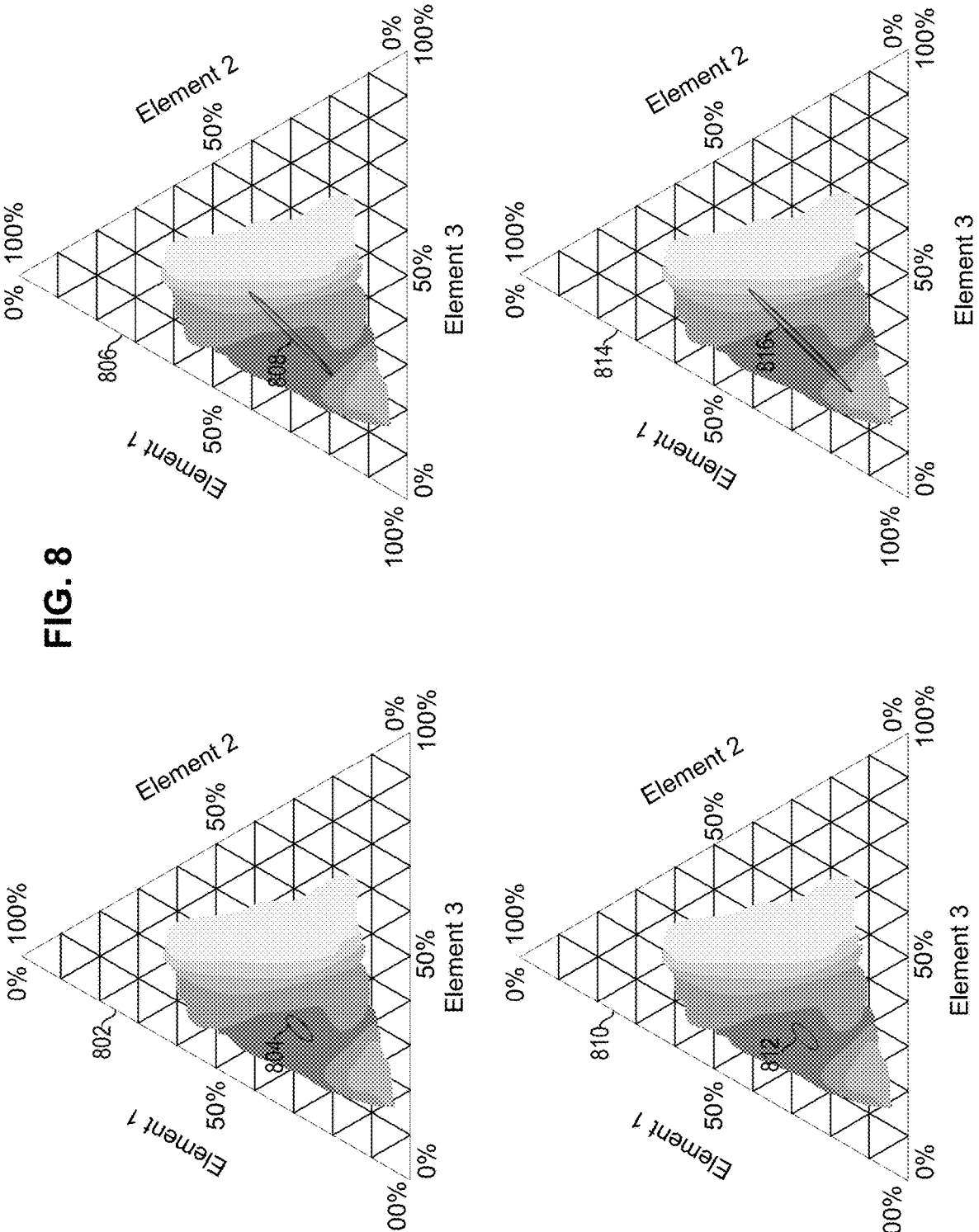
FIG. 8 illustrates solidus temperature changes due to composition migration in memory cells of different decks having different initial elemental composition in accordance with certain embodiments.

FIG. 7 illustrates solidus temperature changes due to elemental composition evolution in memory cells of different decks having the same initial elemental composition in accordance with certain embodiments. The solidus temperatures depicted in FIG. 7 and FIG. 8 are example illustrations only and are adapted from Synthesis and Screening of Phase Change Chalcogenide Thin Film Materials for Data Storage, ACS Comb. Sci. 2017, 19, 7, 478-491. FIG. 7 depicts a ternary phase diagram 702 for various compositions of three elements (element 1, element 2, and element 3, such as telluride, antimony, and germanium, although in other embodiments any suitable elements may be used within a storage element) and corresponding solidus temperatures for various elemental compositions. Phase diagram 702 includes a composition region 704 showing an initial region that includes all of the different compositions present in memory cells of a memory array at the time of manufacture. When the storage elements of a deck (or the entire array) are deposited at an initial elemental composition (e.g., X % of element 1, Y % of element 2, and Z % of element 3), process constraints may result in a slight variance of the compositions within the various memory cells. An initial elemental composition may be equal to the mean percentage by mass for the various elements across the various storage elements that are deposited at the initial elemental composition. For example, the mean percentage by mass of elements 1, 2, and 3 across the memory cells of the array may be X %, Y %, and Z %, while the percentage of one or more of these elements with the storage element of any particular memory cell of the array may vary slightly (e.g., by 1% or less from the mean percentage, although the actual variance range is dependent on the process used). Since there may be slight variations in the actual initial elemental compositions of the various storage elements, the range of elemental compositions is depicted as a region 704. In this illustration, the region 704 may represent the various elemental compositions of the storage elements of the cells of multiple decks of the memory array.

As described earlier, the elemental compositions of the memory cells may evolve differently in different decks. Ternary phase diagram 706 displays an elemental composition region 708 for a first deck and diagram 710 displays an elemental composition region 712 for a second deck. The region 708 and 712 depict the elemental compositions of the memory cells of the respective decks after a large number of program cycles have been performed on the cells. As illustrated, the elemental compositions of region 712 for the second deck have some elemental compositions that exhibit higher solidus temperatures than the elemental compositions of region 708 for the first deck. The compositions at the higher temperatures may increase the difficulty of changing states (e.g., by crystallizing) the storage elements having such compositions, and thus may hinder efficient operation of the memory cells of the respective deck.

FIG. 8 illustrates solidus temperature changes due to elemental composition evolution in memory cells of two decks having different initial elemental compositions in accordance with certain embodiments. Phase diagram 802 includes a composition region 804 showing an initial region that includes all of the different compositions present in memory cells of a first deck of a memory array at the time of manufacture (where the storage elements of the first deck are deposited at a targeted initial composition and the region 804 represents the range of initial compositions due to natural variations introduced during manufacturing). Phase diagram 806 and region 808 depict the evolution of the elemental compositions of the memory cells of the first deck after a number of program cycles.

Phase diagram 810 includes a composition region 812 showing an initial region that includes all of the different compositions present in memory cells of a second deck of a memory array at the time of manufacture and phase diagram 814 and region 816 depict the evolution of the elemental compositions of the memory cells of the first deck after the same number of program cycles. In order to compensate for the different manner in which the elemental compositions evolve between the decks, the initial elemental composition at which storage elements of the memory cells of a first deck are deposited may be different from the initial elemental composition at which storage elements of the memory cells of a second deck are deposited. In the embodiment depicted, the initial composition for the second deck may be selected such that the the region 812 of the initial elemental compositions of the second deck is shifted relative to region 804 (by changing the compositions of the elements making up the initial composition for the second deck relative to the initial composition for the first deck). By adjusting the initial elemental composition, the elemental compositions present after a number of program cycles are shifted as well (relative to what the elemental compositions of the second deck would be if the same initial composition for the first deck had also been used to deposit the storage elements of the second deck) to more closely match the elemental compositions of the other deck. For example, in the embodiment depicted, the region 816 does not have any elemental compositions exhibiting solidus temperatures in the highest range of temperatures (contrary to the elemental compositions of region 712). In various embodiments, the initial elemental composition may be fine-tuned by deck based on the thermoelectric dynamic environment of the deck in order to optimize the nucleation and/or growth termination processes so that electrical characteristics between decks are matched in spite of different elemental composition evolutions between decks.

When different initial elemental compositions are used for different decks, the initial elemental compositions between any two decks may differ by any suitable amount (that is greater than a de minimus difference between the decks that could occur despite an attempt to deposit the decks at the same elemental compositions). For example, in one embodiment, at least one element may differ between the compositions by at least 0.25%. For example, if an initial elemental composition for a first deck is 25% of element 1, 50% of element 2, and 25% of element 3, an initial elemental composition for a second deck could be 24.75% of element 1, 50.25% of element 2, and 25% of element 3. As another example, the initial elemental composition for the second deck could be 25.25% of element 1, 49.85% of element 2, and 24.9% of element 3. In various embodiments, at least one element may differ by at least 0.5%, 0.75%, or 1% between the initial elemental compositions for different decks.

In some embodiments, the different initial elemental compositions may include one or more elements that are not varied. For example, an initial elemental composition for a first deck may be 25% of element 1, 47% of element 2, 25% of element 3, and 3% of one or more other elements, and the initial elemental composition for the second deck could be 24% of element 1, 46% of element 2, 27% of element 3, and 3% of the one or more other elements.

In various embodiments, the storage elements of even decks may be deposited at a first initial elemental composition and the storage elements of odd decks may be deposited at a second initial elemental composition, wherein the difference between the first and second initial elemental compositions is based on the difference in the thermoelectric dynamic environment between the odd decks and the even decks. In some embodiments, the storage elements of the inner and outer decks may be deposited at different initial elemental compositions. In various embodiments, the storage elements of each deck may be deposited at unique initial elemental compositions.

The selection of the initial elemental composition for a deck may be based on any suitable factors. For example, the factors may include geometries of the storage elements or surrounding components of the memory cells, the direction of current flow in the memory cell during program and/or read operations, desired speed for program and/or read operations, desired endurance of the memory cell, desired energy usage to perform program and/or read operations, desired distribution width of speeds among cells of a deck, desired nucleation speed, desired growth speed (e.g., termination phase of crystal growth), or suitable factor, or any combination thereof.

FIG. 9 illustrates a flow for manufacturing a memory array in accordance with certain embodiments. At 902 a first deck of first memory cells are formed, wherein forming the first deck comprises depositing a plurality of storage elements of the memory cells at a first initial composition of a plurality of elements of a chalcogenide material. At 904, a second deck of second memory cells is formed above the first deck of memory cells, wherein forming the second deck of second memory cells comprises depositing a plurality of storage elements of the second memory cells at a second initial composition of the plurality of elements of the chalcogenide material.

The flows described in herein (e.g., FIG. 9) are merely representative of operations that may occur in particular embodiments. Some of the operations illustrated in the FIGS. may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory partition controller 210, wordline control logic 214, bitline control logic 216, WL switch circuitry 220, BL switch circuitry 224, access circuitry 342, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g. reset, while an updated value potentially includes a low logical value, e.g. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (e.g., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 may include memory device including a memory array comprising a plurality of decks, a respective deck comprising a plurality of memory cells, a respective memory cell comprising a storage element comprising a chalcogenide material; wherein a first deck of the plurality of decks comprises first memory cells with storage elements deposited at a first initial composition of a plurality of elements; and a second deck of the plurality of decks comprises second memory cells with storage elements deposited at a second initial composition of the plurality of elements.

Example 2 may include the subject matter of Example 1, wherein the first memory cells with storage elements deposited at the first initial composition are coupled to first access circuitry to program the first memory cells using a program pulse having a positive polarity and the second memory cells with storage elements deposited at the second initial composition are coupled to second access circuitry to program the second memory cells using a program pulse having a negative polarity.

Example 3 may include the subject matter of any one of Examples 1-2, wherein the first deck of the plurality of decks is an outer deck and the second deck of the plurality of stacked decks is an inner deck.

Example 4 may include the subject matter of any one of Examples 1-3, wherein the first initial composition and second initial composition include differing percentages of the plurality of elements.

Example 5 may include the subject matter of any one of Examples 1-4, wherein a third deck of the plurality of decks comprises first memory cells with storage elements deposited at the first initial composition of the plurality of elements.

Example 6 may include the subject matter of any one of Examples 1-4, wherein a third deck of the plurality of decks comprises first memory cells with storage elements deposited at a third initial composition of the plurality of elements.

Example 7 may include the subject matter of any one of Examples 1-6, wherein respective memory cells of the plurality of decks comprise a first layer of chalcogenide material to function as a selector device and a second layer of chalcogenide material to function as the storage element.

Example 8 may include the subject matter of any one of Examples 1-7, further comprising a plurality of memory chips, wherein a first memory chip of the plurality of memory chips comprises the memory array.

Example 9 may include the subject matter of Example 8, further comprising a memory controller to communicate with the plurality of memory chips.

Example 10 may include the subject matter of any one of Examples 1-9, wherein the memory device comprises a solid state drive.

Example 11 may include the subject matter of any one of Examples 1-10, wherein the memory device comprises a dual in-line memory module.

Example 12 may include a method comprising forming a first deck of first memory cells, wherein forming the first deck comprises depositing a plurality of storage elements of the memory cells at a first initial composition of a plurality of elements of a chalcogenide material; and forming a second deck of second memory cells above the first deck of memory cells, wherein forming the second deck of second memory cells comprises depositing a plurality of storage elements of the second memory cells at a second initial composition of the plurality of elements of the chalcogenide material.

Example 13 may include the subject matter of Example 12, further comprising forming, between the first deck and the second deck, a layer of access lines to be shared by the first deck and the second deck.

Example 14 may include the subject matter of any one of Examples 12-13, further comprising forming a third deck of third memory cells above the second deck of memory cells, wherein forming the third deck of third memory cells comprises depositing a plurality of storage elements of the third memory cells at the first initial composition of the plurality of elements of the chalcogenide material.

Example 15 may include the subject matter of any one of Examples 1-14, further comprising forming a third deck of third memory cells above the second deck of memory cells, wherein forming the third deck of third memory cells comprises depositing a plurality of storage elements of the third memory cells at a third initial composition of the plurality of elements of the chalcogenide material.

Example 16 may include the subject matter of any one of Examples 1-15, wherein the first deck of the plurality of decks is an inner deck and the second deck of the plurality of stacked decks is an outer deck.

Example 17 may include memory device including a memory array comprising a plurality of decks, a respective deck comprising a plurality of memory cells, a respective memory cell comprising a storage element comprising a chalcogenide material; wherein a first deck of the plurality of decks comprises first memory cells with storage elements deposited at a first initial composition of a plurality of elements; and a second deck of the plurality of decks comprises second memory cells with storage elements deposited at a second initial composition of the plurality of elements.

Example 18 may include the subject matter of Example 17, wherein the first memory cells with storage elements deposited at the first initial composition are coupled to first access circuitry to program the first memory cells using a program pulse having a positive polarity and the second memory cells with storage elements deposited at the second initial composition are coupled to second access circuitry to program the second memory cells using a program pulse having a negative polarity.

Example 19 may include the subject matter of any one of Examples 17-18, wherein the first deck of the plurality of decks is an outer deck and the second deck of the plurality of stacked decks is an inner deck.

Example 20 may include the subject matter of any one of Examples 17-19, wherein the first initial composition and second initial composition include differing percentages of the plurality of elements.

Example 21 may include the subject matter of any one of Examples 17-20, wherein a third deck of the plurality of decks comprises first memory cells with storage elements deposited at the first initial composition of the plurality of elements.

Example 22 may include the subject matter of any one of Examples 17-20, wherein a third deck of the plurality of decks comprises first memory cells with storage elements deposited at a third initial composition of the plurality of elements.

Example 23 may include the subject matter of any one of Examples 17-22, wherein respective memory cells of the plurality of decks comprise a first layer of chalcogenide material to function as a selector device and a second layer of chalcogenide material to function as the storage element.

Example 24 may include the subject matter of any one of Examples 17-23, further comprising a plurality of memory chips, wherein a first memory chip of the plurality of memory chips comprises the memory array.

Example 25 may include the subject matter of Example 24, further comprising a memory controller to communicate with the plurality of memory chips.

Example 26 may include the subject matter of any one of Examples 17-25, wherein the memory device comprises a solid state drive.

Example 27 may include the subject matter of any one of Examples 17-26, wherein the memory device comprises a dual in-line memory module.

What is claimed is:

1. A memory device including:

a memory array comprising a plurality of decks, a respective deck comprising a plurality of memory cells, a respective memory cell comprising a storage element comprising a chalcogenide material; wherein:

a first deck and a third deck of the plurality of decks comprise first memory cells with storage elements deposited at a first initial composition of a plurality of elements;

a second deck and a fourth deck of the plurality of decks comprise second memory cells with storage elements deposited at a second initial composition of the plurality of elements different from the first initial composition of the plurality of elements; and wherein the first initial composition and second initial composition are selected such that after a particular number of program cycles have been performed to the first memory cells and the particular number of program cycles have been performed to the second memory cells:

a third altered local composition of the first memory cells more closely matches a fourth altered local composition of the second memory cells than the first initial composition and the second initial composition.

2. The memory device of claim 1, wherein the first memory cells with storage elements deposited at the first initial composition are coupled to first access circuitry to program the first memory cells using a first program pulse having a positive polarity and the second memory cells with storage elements deposited at the second initial composition are coupled to second access circuitry to program the second memory cells using a second program pulse having a negative polarity.

3. The memory device of claim 1, wherein the first deck and the third deck of the plurality of decks are outer decks and the second deck and fourth deck of the plurality of decks are inner decks.

4. The memory device of claim 1, wherein the first initial composition and second initial composition include differing percentages of the plurality of elements.

5. The memory device of claim 1, wherein the second deck is between the first deck and the third deck and wherein the third deck is between the second deck and the fourth deck.

6. The memory device of claim 1, wherein a fifth deck of the plurality of decks comprises third memory cells with storage elements deposited at a third initial composition of the plurality of elements.

7. The memory device of claim 1, wherein respective memory cells of the plurality of decks comprise a first layer of chalcogenide material to function as a selector device and a second layer of chalcogenide material to function as the storage element.

8. The memory device of claim 1, further comprising a plurality of memory chips, wherein a first memory chip of the plurality of memory chips comprises the memory array.

9. The memory device of claim 8, further comprising a memory controller to communicate with the plurality of memory chips.

10. The memory device of claim 1, wherein the memory device comprises a solid state drive or a dual in-line memory module.

11. A method comprising:

forming a first deck and a third deck of first memory cells, wherein forming the first deck and the third deck comprises depositing a plurality of storage elements of the first memory cells at a first initial composition of a plurality of elements of a chalcogenide material;

forming a second deck and a fourth deck of second memory cells, wherein forming the second deck and the fourth deck of second memory cells comprises depositing a plurality of storage elements of the second memory cells at a second initial composition of the plurality of elements different from the first initial composition of the plurality of elements of the chalcogenide material; and selecting the first initial composition and second initial composition such that after a particular number of program cycles have been performed to the first memory cells and the particular number of program cycles have been performed to the second memory cells:

a third altered local composition of the first memory cells more closely matches a fourth altered local composition of the second memory cells than the first initial composition and the second initial composition.

12. The method of claim 11, further comprising forming, between the first deck and the second deck, a layer of access lines to be shared by the first deck and the second deck.

13. The method of claim 11, wherein a difference between the first and second initial compositions is based on a difference in a thermoelectric dynamic environment between the first deck and the second deck.

14. The method of claim 11, further comprising forming a fifth deck of third memory cells above the second deck of memory cells, wherein forming the fifth deck of third memory cells comprises depositing a plurality of storage elements of the third memory cells at a third initial composition of the plurality of elements of the chalcogenide material.

15. The method of claim 11, wherein the first deck of the plurality of decks is an inner deck and the second deck of the plurality of decks is an outer deck.

16. The method of claim 11, wherein the first initial composition and second initial composition include differing percentages of the plurality of elements.

17. The method of claim 11, further comprising selecting the first initial composition of the plurality of elements of the chalcogenide material based on geometries of storage elements or surrounding components of the first memory cells, a direction of current flow in the first memory cells during program and read operations, a speed for program and read operations of the first memory cells, an endurance of the first memory cells, an energy usage to perform program and read operations, a distribution width of speeds among the first memory cells, a nucleation speed, and a growth speed.

18. A system comprising:

a storage device controller; and at least one memory chip coupled to the storage device controller, wherein a memory chip comprises:

a memory array comprising a plurality of decks, a respective deck comprising a plurality of memory cells, a respective memory cell comprising a storage element comprising a chalcogenide material; wherein:

a first deck and a third deck of the plurality of decks comprise first memory cells with storage elements deposited at a first initial composition of a plurality of elements;

a second deck and a fourth deck of the plurality of decks comprise second memory cells with storage elements deposited at a second initial composition of the plurality of elements different from the first initial composition of the plurality of elements; and wherein the first initial composition and second initial composition are selected such that after a particular number of program cycles have been performed to the first memory cells and the particular number of program cycles have been performed to the second memory cells:

a third altered local composition of the first memory cells more closely matches a fourth altered local composition of the second memory cells than the first initial composition and the second initial composition.

19. The system of claim 18, further comprising a processor to generate data to be stored by the memory array, the processor to couple to the at least one memory chip through the storage device controller.

20. The system of claim 19, further comprising one or more of: a battery communicatively coupled to the processor, a display communicatively coupled to the processor, or a network interface communicatively coupled to the processor.

* * * * *